March 9, 1954 L. PESSEL 2,671,264

METHOD OF SOLDERING PRINTED CIRCUITS

Filed May 24, 1952

INVENTOR.

LEOPOLD PESSEL

BY W. S. Hill

AGENT

Patented Mar. 9, 1954 2,671,264

UNITED STATES PATENT OFFICE 2,671,264

METHOD OF SOLDERING PRINTED CIRCUITS

Leopold Pessel, Whitemarsh Village, Pa., assignor to Radio Corporation of America, a corporation of Delaware Application May 24, 1952, Serial No. 289,768

12 Claims. (Cl. 29—359)

Figures 1, 2, 3, 4:
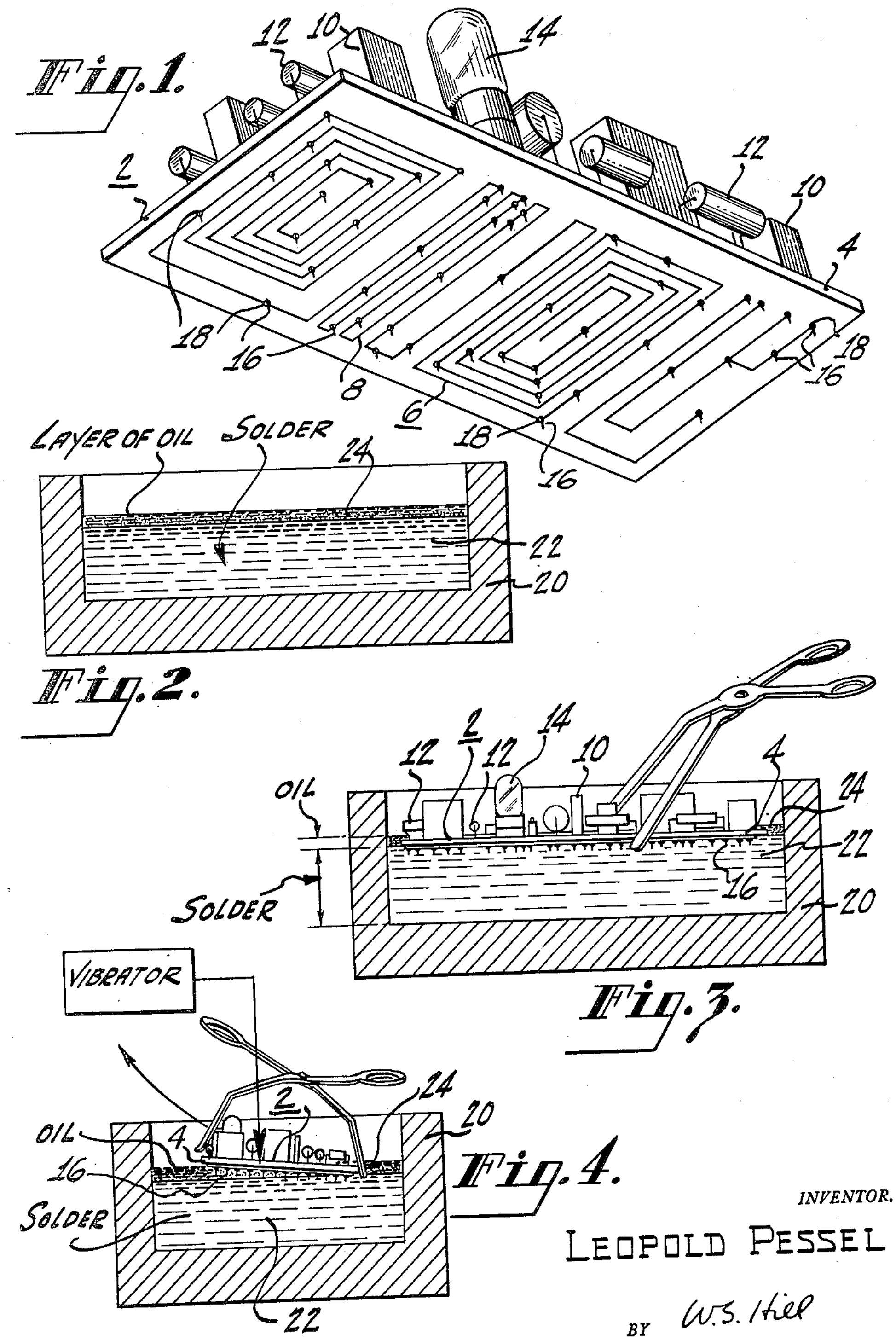

This invention relates, in general, to an improved method of soldering and, more particularly, to an improved method of soldering simultaneously all of the connections of an assembly which includes a plurality of electrical conductors disposed on a surface of electrically insulating material.

Although various types of printed circuits have been utilized in the past, one common type has comprised a sheet of electrically insulating material, such as laminated sheets of paper impregnated with a synthetic resin and carrying on one surface of the sheet one or more electrical conductors in the form of thin, flat stripes or strips integrally united to the insulating material. Where it is desired to mount a number of circuit components on the other side of the sheet of insulating material and connect them at many points to the printed conductors on the side previously mentioned, there is a considerable problem in making the connections rapidly and efficiently. In a typical assembly, over one hundred connections may be involved, and to make each one of these connections individually with a soldering iron is a tedious process. Consequently, it is desirable to be able to use a process which will enable an operator to solder all of the connections in the same operation or operations. One method of soldering all such connections simultaneously is a dip-soldering technique. In this type of process, the entire side of the assembly containing the printed conductors, with the leads from the circuit components projecting through the various points, can be dipped face down in a bath of molten solder and removed after a brief period of immersion. This results in coating the conductors with solder and soldering all the connections at the same time. However, it has been found that, when the conductors are closely spaced, some of the solder almost always bridges across the closely spaced conductors in places where it is not wanted and therefore causes "shorts."

The present invention relates to an improved process of dip soldering an assembly such as above described in such a manner as to eliminate all excess solder connections between points on the printed circuit where they are not desired.

One object of the present invention is to provide an improved dip-soldering technique applicable to printed circuits.

Another object of the invention is to provide an improved process of dip-soldering printed circuits where the conductors are integrally united to a surface of an insulating material.

Another object of the invention is to provide an improved process of soldering, simultaneously, a large number of conventional circuit components to a printed circuit.

Still another object of the invention is to provide an improved soldering process including a method of removing excess solder from spaces between electrical conductors united to a surface of a body of electrically insulating material.

These and other objects will be more apparent, and the invention will be more clearly understood from the following detailed description and the accompanying drawings of which:

Figure 1 is a perspective view of the under side of an assembly to which the soldering technique of the present invention may be applied, Figure 2 is a view in cross section of a solder bath including a layer of material for removing excess solder, used in the process of the present invention, Figure 3 is a cross-sectional view showing one manner of immersing the assembly of Figure 1 in the bath of Figure 2, and Figure 4 is a perspective view showing a preferred way of removing the assembly of Figure 1 from the bath of Figure 2.

In general, the process of the present invention comprises an initial step of immersing the under face of the assembly to be soldered in a conventional bath of molten solder. As a result of this step, each of the electrical conductors is coated with solder, but excess solder usually remains adhered to the electrically insulating surface between the conductors. The next step in the process is to immerse the assembly in a second bath of molten material. The second bath contains solder which may be similar to that in the first bath and a top layer of a relatively inert organic liquid which may be selected from a class consisting of oils, waxes, and resins which are thermally stable between about 400° F. and 600° F. The assembly is exposed to and preferably manipulated in the second bath until substantially all the solder adhering to the insulating material surface is removed therefrom.

A preferred example of a process in accordance with the present invention will now be given.

*Example 1*

Referring now to Figure 1, an assembly 2 is prepared for soldering comprising a mounting plate 4 which may be composed of laminated sheets of paper impregnated and surfaced with a synthetic resin. It has disposed on a surface thereof an electrical circuit 6 composed of a plurality of leads or conductors, e. g. fine strips 8 of copper foil. The strips are integrally united to a surface of the synthetic resin-impregnated plate. Mounted on the side of the mounting plate which is opposite from that holding the electrical circuit, are a plurality of circuit components such as capacitors 10, resistors 12, and vacuum tubes 14. These circuit components are provided with wire leads 16 which project through the plate 4. Small diameter holes 18 are provided in the plate to accommodate the wire leads.

In carrying out the soldering operation, the lower side of this assembly is first brought into contact with a flux such as a solution of alcoholic rosin. It is then removed from the flux and promptly dipped, lower face down, beneath the surface of a bath of molten solder which may be of any conventional composition such as 60% tin and 40% lead. This solder bath will be maintained at a temperature appropriate to particular solder being used. Such temperature will conventionally be about 400° F. to 600° F.

Upon removal of the assembly from the solder bath, the strips of copper foil will be found to be completely coated with solder and all of the leads 16 soldered to the strips. However, it will usually also be found that excess solder remains adhered to the various parts of the resin-coated surface of the mounting plate between the copper strips. These "bridgings" are, of course, undesirable since they would result in short circuits when the assembly is used.

Referring now to Figures 2 and 3, the next stage in the process is to lower the assembly, after its removal from the first solder bath and printed circuit face down, into a vessel 20 containing another solder bath 22 having floating thereon a layer of liquid 24. Preferably, the immersion in the second bath is caused to take place immediately after the first solder dip to avoid reheating the laminated base plate and the circuit components. This lessens the possibility of damage to these parts. The solder again may be 60% tin and 40% lead. The liquid layer 24 may be composed of molten Cerese wax and may be approximately $\frac{1}{16}''$ thick. The entire bath may be maintained at a temperature appropriate to the material used and which may be in the range of 400° F. to 600° F. When the assembly is dipped in the solder layer, it is agitated horizontally for a few seconds, e. g. 10 seconds, with the printed circuit at the inter-face between the solder layer and the wax layer. In order to eliminate the possibility of trapping air bubbles, the assembly should also be rocked gently about its horizontal longitudinal axis. During this period of treatment, it is preferable that there be repeated contact of the tinned, i. e. leads coated with solder, circuit with the surface of the molten solder pool under the wax.

The final stage in the process is the removal of the assembly from the bath by first tilting the assembly about its horizontal longitudinal axis at an angle of about 5° and moving the base plate forward and upward at this angle slowly and until the plate loses contact with the solder and then with the wax. In a successful use of the invention, the tilting motion required about three seconds and the assembly was withdrawn at a rate of about five seconds per inch of travel, such rate being maintained as long as any portion of the circuit was in contact with any part of the bath. The rate at which the assembly can be withdrawn depends partly upon the closeness of spacing of the conductors. The larger the distance between adjacent conductors, the more rapid can be the withdrawal.

In the process described above the function of the wax layer is to flow the solder adhering to the synthetic resin surface away from such insulating areas without undesirable removal from the conducting metal surfaces. The solder appears to be repelled from the insulating surface and to be attracted by the cohesive force of the solder bath in being returned thereto.

In the above example, many variations may be made without departing from the scope of the invention. For example, the solder composition may be of any conventional type. Also, the liquid layer above the solder may be any one of a large number of oils, waxes, or resins which do not decompose between the temperatures of 400° F. and 600° F. which are commonly used for maintaining the solder in a molten state.

Another example is as follows:

*Example 2*

A printed circuit similar to the one described in Example 1, and having various circuit components mounted thereon, as shown in Figure 1, is immersed, without prefluxing, in a bath of solder having a composition 35% tin and 65% lead, the temperature of the bath being maintained at about 500° F. The technique of dipping is the same as in Example 1.

After the soldering stage has been completed, the under side of the assembly is brought into contact with the inter-face between a bath of molten solder having the composition 35% tin and 65% lead and a layer of castor oil. The temperature of this bath is also maintained at about 500° F. After agitation at the interface and removal of the assembly as described in Example 1, the excess castor oil is washed off by rinsing in toluol, and the cleaned assembly is dried in air.

*Example 3*

A printed circuit and component assembly of the type shown in Figure 1 but having electrical conductors of silver printed on a steatite plate, the silver having been integrally united to the steatite plate by a firing process, is subjected to an initial soldering process as described in the preceding examples. This time, however, the soldering bath as a composition of 82.5% cadmium and 17.5% zinc and is kept at a temperature of 520° F. Where fluxing is desired, a treatment with zinc-ammonium chloride is used. After the soldering stage, the assembly is permitted to cool and the soldered portion is then scrubbed with warm water to remove all flux residues. The cleaned plate is then dried. As in the preceding examples, the under face of the plate containing the printed circuit is then agitated at the interface between a layer of molten solder having the same composition as in the preceding stage and a layer of molten polyethylene resin. This bath is maintained at a temperature of about 520° F. The technique of withdrawing the treated plate from the bath is the same as in the preceding examples.

A number of different materials can be used for the liquid layer which is floated on top of the solder bath. In general, the material may be a relatively inert organic liquid, preferably a wax, oil, or resin which does not decompose at the temperature at which the solder bath must be maintained. In other words, the material should not decompose within the temperature range of about 400° F. to 600° F. Typical waxes which may be used are any petroleum hydrocarbon wax such as Cerese wax, or an animal product wax such as beeswax, or vegetable waxes. Examples of oils which have been found satisfactory are mineral oil, silicone oil, petroleum hydrocarbon oils, hydrogenated peanut oil, palm oil, castor oil, linseed oil, perilla oil and sperm oil. Especially preferred are petroleum oils composed of at least 20%, and preferably more than 50% of cyclic hydrocarbons. Various resins can also be used. Among the resins which have been found useful are polybutene, polyindene, dipentene resins, allyl resins, and polyethylene. In general, any resin may be used which can be melted to form a non-viscous liquid which is thermally stable at the temperature of the molten solder bath.

It has also been found that esters, such as butyl stearate, and propylene laurate, are operative, also relatively inert organic liquids such as glyceryl phthalate, methoxy polyethylene glycol, and phenyl diglycol carbonate.

The particular material selected for the liquid layer floating on the solder depends, in part, on the exact results desired. As previously stated, the principal function of this layer is to provide an agent for causing the solder adhering to the insulating surface to be repelled therefrom and to be drawn back into the main body of the solder bath. If it is also desired that the material of this liquid layer be more or less completely removed from the assembly after treatment, it is desirable to use an oil which is liquid at room temperatures. These oils can usually be washed off the assembly with toluol or other common organic solvents. Vapor degreasing may also be used. If it is desired that the liquid used to repel the solder act as a protective agent for the circuit components afterwards, it is then desirable to use a material which has a waxy or resinous nature. To these waxes may be added plasticizing and anti-fungus agents, if desired.

A further feature of the invention is the use of vibrations in the sonic or ultrasonic range, applied to the printed circuit assembly or to the bath, during the initial soldering step, or during the excess solder removal step, or during both stages of the operation.

This modification of the process may be carried out as follows. As the assembly is being removed from the first solder bath, a vibratory head may be applied against the upper surface of the plate and held there until the under side of the plate loses contact with the surface of the solder. Vibration frequencies as low as 40 cycles and as high as 24,000 cycles have been tried. Improvement was found in all cases in that the assembly could be withdrawn from the solder bath more rapidly with much less excess solder bridging the gaps across the insulating surface between the conductors. In a similar manner, vibrations may also be applied to the assembly as it is being withdrawn from the second bath which includes the layer of oil, wax, or resin floating on a layer of molten solder. Here the use of vibrations is even more effective.

Although the effect is greatest when the vibrations are applied directly to the base plate carrying the printed circuit, a similar, though not as pronounced, effect is obtained by applying the vibrations to the bath, as through the walls of the container.

Although the reasons for the improvement obtained by imparting vibrations to either the bath or the circuit are not entirely understood, the effect appears to be one of weakening the attractive forces between the surface of the insulating material and the solder.

In the examples previously given, the method of withdrawing the assembly from the second bath was to tilt it about its longitudinal axis at a small angle of, say 5°, although this may be somewhat larger, as 10 or 15°, and to move it forward and upward until it emerged from the liquid. This is only a preferred method, however, which is used to advantage if the conductors are very closely spaced, as, for example, 0.01 inch apart. The removal may also be carried out by tilting slightly and lifting the assembly vertically, or, if the conductors are widely spaced, by simply lifting without tilting.

I claim as my invention:

1. A method of dip soldering an assembly comprising a plurality of electrical conductors disposed on a surface of a sheet of insulating material, said conductors being so closely spaced that some solder bridging normally occurs when said assembly is dipped in molten solder, said method comprising immersing said assembly in a bath of molten solder and removing said assembly from said bath whereby said conductors are coated with solder but some of said solder adheres to said insulating material surface between said conductors, then, dipping said assembly in a second bath of molten solder having floating thereon a layer of relatively inert liquid material, agitating said assembly, with said insulating material surface face down, at the interface between said second solder bath and said floating layer until substantially all of said solder adhering to said insulating material surface between said conductors is removed, and removing said assembly from said floating layer.

2. A method according to claim 1 in which said assembly is removed from said second solder bath by tilting said insulating material surface at a small angle to the horizontal and moving said assembly slowly forward and upward.

3. A method according to claim 1 in which said conductors are made of copper.

4. A method according to claim 1 in which said conductors are made of silver.

5. A method according to claim 1 in which said insulating material is a phenolic resin.

6. A method according to claim 1 in which said floating layer is a petroleum hydrocarbon wax.

7. A method according to claim 1 in which said floating layer is a petroleum oil containing at least 20% cyclic hydrocarbons.

8. A method according to claim 1 in which the liquid of said floating layer is selected from the class consisting of oils, waxes, and resins which are thermally stable at temperatures up to about 600° F.

9. A method according to claim 1 in which said assembly is removed from said second solder bath by tilting said insulating material surface at a small angle to the horizontal and moving said assembly slowly in a vertical direction.

10. A method according to claim 1 wherein the dipping in said second bath occurs immediately after removal from said first bath.

11. A method of dip soldering an assembly comprising a plurality of electrical conductors disposed on a surface of a sheet of insulating material, said conductors being so closely spaced that some solder bridging normally occurs when said assembly is dipped in molten solder, comprising immersing said assembly in a bath of molten solder and removing said assembly from said bath whereby said conductors are coated with solder but some of said solder adheres to said insulating material surface between said conductors, then dipping said assembly in a second bath of molten solder having floating thereon a layer of relatively inert liquid material, holding said assembly, with said conductors face downward, at the interface between the second solder bath and said floating layer while making repeated contact between the solder adhering to said insulating surface and the molten solder in said second bath until substantially all of said solder adhering to said insulating surface between said conductors is removed, and removing said assembly from said floating layer.

12. A method according to claim 11 in which vibrations within the sonic and ultrasonic range are applied to said assembly while it is in contact with the surface of at least one of said solder baths.

LEOPOLD PESSEL.

References Cited in the file of this patent

UNITED STATES PATENTS

| Number | Name | Date |
|---|---|---|
| 1,719,512 | Krembs | July 2, 1929 |
| 1,837,962 | Hensgen | Dec. 22, 1931 |
| 2,161,556 | Carroll | June 6, 1939 |
| 2,426,650 | Sivian | Sept. 2, 1947 |
| 2,607,821 | Van Arsdell | Aug. 19, 1952 |